(12) United States Patent
Lin et al.

(10) Patent No.: US 11,598,006 B2
(45) Date of Patent: *Mar. 7, 2023

(54) WAFER SUPPORT AND THIN-FILM DEPOSITION APPARATUS USING THE SAME

(71) Applicant: SKY TECH INC., Hsinchu County (TW)

(72) Inventors: Jing-Cheng Lin, Hsinchu County (TW); Chun-Fu Wang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 203 days.

This patent is subject to a terminal disclaimer.

(21) Appl. No.: 17/144,886

(22) Filed: Jan. 8, 2021

(65) Prior Publication Data

US 2022/0220615 A1 Jul. 14, 2022

(51) Int. Cl.
| C23C 16/458 | (2006.01) |
| C23C 14/34 | (2006.01) |
| H01J 37/34 | (2006.01) |
| C23C 14/50 | (2006.01) |
| C23C 14/54 | (2006.01) |
| C23C 16/503 | (2006.01) |

(52) U.S. Cl.
CPC ........ *C23C 16/4586* (2013.01); *C23C 14/345* (2013.01); *C23C 14/50* (2013.01); *C23C 14/541* (2013.01); *C23C 16/503* (2013.01); *H01J 37/3411* (2013.01); *H01J 37/3435* (2013.01)

(58) Field of Classification Search
CPC ... C23C 16/4586; C23C 14/345; C23C 14/50; C23C 14/541; C23C 16/503; H01J 37/3411; H01J 37/3435
USPC ......... 204/298.09; 118/724, 725; 156/345.52
See application file for complete search history.

(56) References Cited

U.S. PATENT DOCUMENTS

| 6,669,783 B2 * | 12/2003 | Sexton ................ H01L 21/6831 156/345.52 |
| 2007/0169703 A1 * | 7/2007 | Elliot .................. C23C 16/4586 156/914 |
| 2010/0210115 A1 * | 8/2010 | Hara ................. H01L 21/67103 438/758 |

(Continued)

*Primary Examiner* — Jennifer Wecker
*Assistant Examiner* — Patrick S Ott
(74) *Attorney, Agent, or Firm* — Chun-Ming Shih; HDLS IPR Services

(57) ABSTRACT

The present disclosure is a wafer support, which includes a heating unit, an insulating-and-heat-conducting unit and a conduct portion, wherein the insulating-and-heat-conducting unit is positioned between the conduct portion and the heating unit. During a deposition process, an AC bias is formed on the conduct portion to attract a plasma disposed thereabove. The heating unit includes at least one heating coil, wherein the heating coil heats the wafer supported by the wafer support via the insulating-and-heat-conducting unit and the conduct portion. The insulating-and-heat-conducting unit electrically insulates the heating unit and the conduct portion to prevent the AC flowing in the heating coil and the AC bias on the conduct portion from conducting each other, so the wafer support can generate a stable AC bias and temperature to facilitate forming an evenly-distributed thin film on the wafer supported by the wafer support.

16 Claims, 3 Drawing Sheets

(56) References Cited

U.S. PATENT DOCUMENTS

| | | | |
|---|---|---|---|
| 2010/0244350 A1* | 9/2010 | Fujisato | H01L 21/68785 269/289 R |
| 2011/0073039 A1* | 3/2011 | Colvin | C23C 16/46 219/490 |
| 2015/0232983 A1* | 8/2015 | West | H01J 37/3244 165/104.34 |
| 2022/0181195 A1* | 6/2022 | Lin | H01L 21/67017 |

* cited by examiner

WAFER SUPPORT AND THIN-FILM DEPOSITION APPARATUS USING THE SAME

TECHNICAL FIELD

The present disclosure relates to a wafer support, more particularly to a thin-film deposition apparatus using the wafer support, which mainly applies an insulating-and-heat-conducting unit to electrically insulate a heating unit and a conduct portion, for preventing a current flowing in the heating coil and an alternating-current bias in the conduct portion from conducting each other, to facilitate forming a thin film with an evenly-distributed thickness on a wafer supported by the wafer support.

BACKGROUND

Chemical vapor deposition (CVD), physical vapor deposition (PVD) and atomic layer deposition (ALD) equipments are commonly employed for manufacturing integrated circuits, light-emitting diodes and displays . . . , etc.

A deposition equipment mainly includes a chamber and a wafer support, wherein a wafer support is positioned within the chamber for supporting at least one wafer. For example in PVD, it is required to dispose a target material in the chamber and have the target material facing the wafer on the wafer support. When performing the PVD, noble gas and/or reactive gas may be transferred into the chamber, then biases are respectively applied on the target material and the wafer support, moreover the wafer support can also heat up the supported wafer. The noble gas within the chamber is ionized by an effect of high-voltage electric field. Then, the ionized noble gas is attracted by the bias applied on the target material to blast the target material. And then atoms or molecules flying out from the target material are attracted by the bias on the wafer support, and deposited on a surface of the heated wafer to form a thin film on the surface of the wafer.

Also, when performing CVD and ALD, it may be required to heat the wafer support and to apply bias on the wafer support, for facilitating to form a thin film with an evenly-distributed thickness on the wafer supported by the wafer support.

SUMMARY

As described in the background, During the deposition process, it is commonly required to apply an alternating-current (AC) bias on the wafer support, then to heat up the wafer support via a heating coil, for improving an uniformity of the thin film deposited on the surface of the wafer. However, the AC flowing in the heating coil and the AC bias on the wafer support may conduct each other, which causes an unstable AC bias on the wafer support and further results in an uneven thickness of thin film deposited on the surface of the wafer. To prevent the abovementioned drawback, an object of the present disclosure is to provide a new wafer support, which mainly uses an insulating-and-heat-conducting unit to electrically insulate the heating coil and the conduct portion on the wafer support, to prevent the AC flowing in the heating coil from interfering the AC bias in the conduct portion, thereby to form a stable AC bias on the wafer support and to improve the uniformity of the thin film forming on the surface of the wafer.

An object of the present disclosure is to provide a wafer support which mainly includes a heating unit, an insulating-and-heat-conducting unit and a conduct portion, wherein the insulating-and-heat-conducting unit is positioned between the heating unit and the conduct portion to electrically insulate the heating unit and the conduct portion. By virtue of disposing the insulating-and-heat-conducting unit, which can prevent the AC flowing in the heating coil and the AC bias on the wafer support from conducting and interfering each other, in order to facilitate forming a stable AC bias in the conduct portion. Meanwhile, the heating unit still can transfer the heat energy to the conduct portion through the insulating-and-heat-conducting unit, then to heat up the wafer supported by the wafer support.

An object of the present disclosure is to provide a wafer support, which mainly includes a heating unit, an insulating-and-heat-conducting unit, a conduct portion, a connecting seat and a securing seat, wherein the insulating-and-heat-conducting unit is positioned between the heating unit and the conduct portion, the securing portion is connected to the heating unit through the connecting portion. The connecting portion includes a plurality of annular-connecting members formed with different radiuses, wherein the annular-connecting member positioned innermost has an upper surface and a lower surface respectively disposed with two O-rings, such that the upper surface and the lower surface of the annular-connecting member are respectively connected to the heating unit and the securing seat through the O-rings.

Furthermore, a cooling passage may be disposed between the O-rings of the annular-connecting members and the adjacent heating unit and/or the heating coil, for decreasing a temperature of the O-ring which is close the heating unit, and prevent the O-ring from thermal degradation due a long exposure under high temperature.

An object of the present disclosure is to provide the abovementioned wafer support, wherein the heating unit of the wafer support includes a plurality of heating coils, and each of the heating coils is used to respectively heat different areas of the wafer support. Moreover, currents flowing to each of the heating coils can be controlled respectively during a heating process, to adjust temperatures of different areas of wafer support, in order to create an evenly-distributed temperature on a surface of the wafer supported by the wafer support.

Moreover, different areas of the wafer support may be respectively disposed with at least one thermal-detecting unit, the thermal-detecting units respectively detects temperatures of different areas of the wafer support. Heating different areas by the heating coils, with the thermal-detecting units to detect temperatures in different areas, an in-time and precise temperature adjustment in each of the areas of the wafer support is possible.

To achieve the abovementioned objects, the present disclosure provides a wafer support for supporting at least one wafer, which includes: at least one heating unit including at least one heating coil for heating the wafer supported by the wafer support; an insulating-and-heat-conducting unit disposed on the heating unit; and a conduct portion disposed on the insulating-and-heat-conducting unit and electrically connected to a bias power source, wherein the insulating-and-heat-conducting unit is positioned between the heating unit and the conduct portion and electrically insulates the heating unit and the conduct portion.

The present disclosure provides a thin-film deposition apparatus, which includes: a chamber including a containing space; a wafer support positioned in the containing space for supporting at least one wafer, and including at least one heating unit that includes at least one heating coil for heating the wafer supported by the wafer support, a conduct portion that is positioned above the heating unit and electrically connected to a bias power source, wherein the bias power source is for forming a bias on the conduct portion, and an insulating-and-heat-conducting unit that is positioned between the heating unit and the conduct portion to insulate the heating unit and the conduct portion; and at least one gas inlet fluidly connected to the containing space of the chamber for transferring a process gas to the containing space.

The abovementioned wafer support, wherein the heating coil includes a first heating coil and a second heating coil, the second heating coil surrounds the first heating coil.

The abovementioned wafer support, further includes a plurality of thermal-detecting units. The first heating coil and second heating coil are used to heat a first area and a second area of the wafer support respectively, and the thermal-detecting units detect temperatures of the first area and the second area of the wafer support respectively.

The abovementioned thin-film deposition apparatus and the wafer support, which includes a support member connected to the wafer support. The support member is disposed with at least one first conduct unit that is electrically connected to the bias power source and the conduct portion. The bias power source forms a bias in the conduct portion via the first conduct unit.

The abovementioned wafer support, wherein the bias power source is an AC power source, which forms a AC bias in the conduct portion via the first conduct unit.

The abovementioned wafer support, further includes at least one second conduct unit positioned within the support member and electrically connected to the heating coil.

The thin-film deposition apparatus as abovementioned, which further includes at least one second conduct unit positioned within the support member and electrically connected to the heating coil. The heating coil includes a first heating coil and a second heating coil, wherein the second heating coil surrounds the first heating coil.

The abovementioned thin-film deposition apparatus, which further includes a drive unit connected to the support member and driving the support member to move the wafer support.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
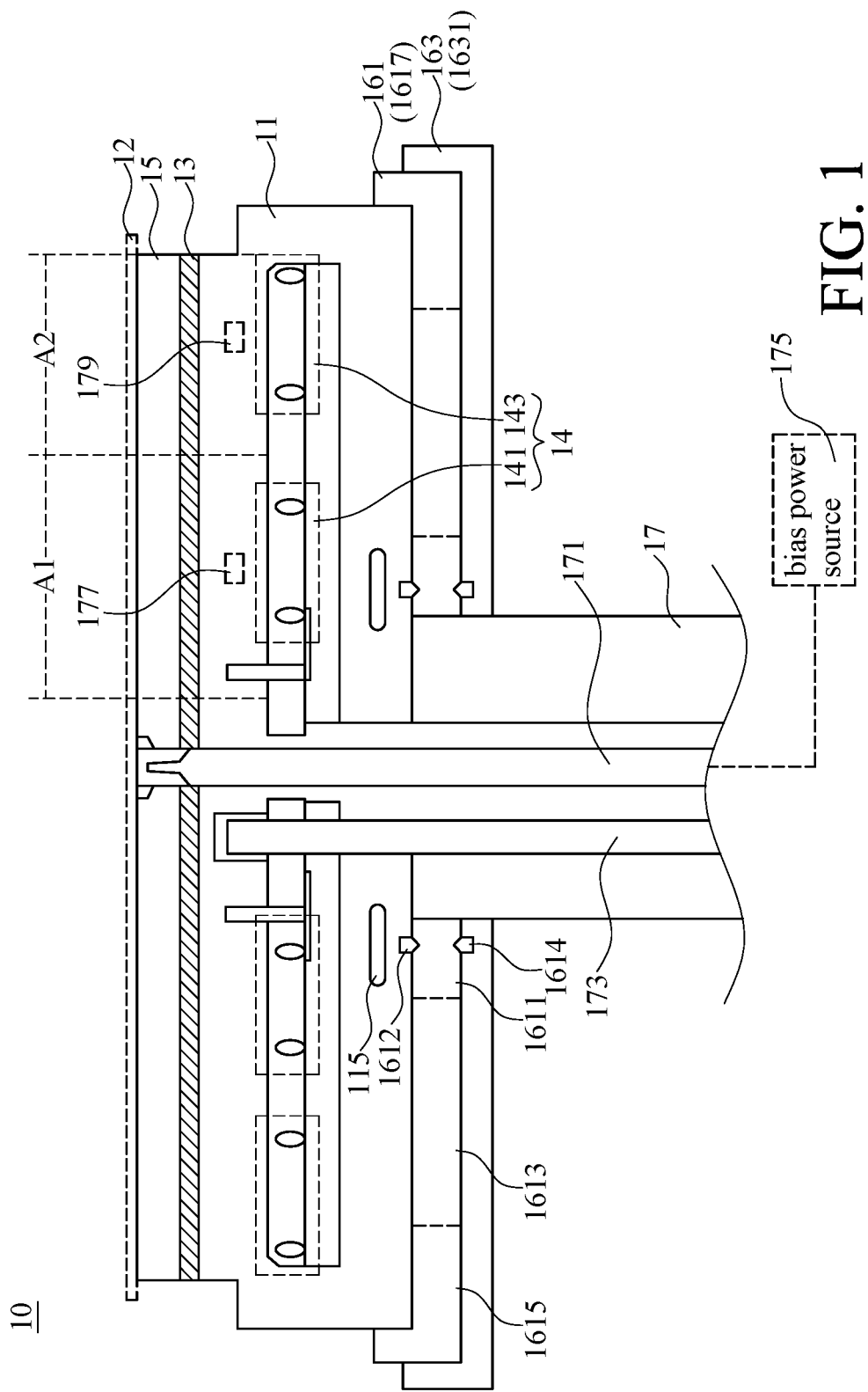
FIG. 1 is a schematic sectional view of a wafer support according to an embodiment of the present disclosure.

Referring to FIG. 1, which is a schematic sectional view of a wafer support 10 according to an embodiment of the present disclosure. As shown, the wafer support 10 is used to support at least one wafer 12, and mainly includes at least one heating unit 11, an insulating-and-heat-conducting unit 13 and a conduct portion 15. Additionally, the heating unit 11, the insulating-and-heat-conducting unit 13 and the conduct portion 15 may have disk-shaped appearances.

The heating unit 11, the insulating-and-heat-conducting unit 13 and the conduct portion 15 are disposed in a stack-up manner. The conduct portion 15 is positioned closest to the wafer 12 supported by the wafer support 10, and the heating unit 11 is positioned farthest from the wafer 12. The insulating-and-heat-conducting unit 13 is positioned the heating unit 11 and the conduct portion 15, to electrically insulate the heating unit 11 and the conduct portion 15.

In one embodiment of the present disclosure, the heating unit 11 includes at least one heating coil 14, wherein the heating coil 14 may be a heating element wire. In use, a current is applied into the heating coil 14, then to heat up the wafer support 10 by electric resistance. In another embodiment of the present disclosure, the heating coil 14 may be an induction coil, and when an AC flows in the heating coil 14, the heating coil 14 then starts electromagnetic induction, thereby to heat up the wafer support 10. In one embodiment of the present disclosure, the wafer support 10, the heating unit 11 or the conduct portion 15 may be disposed with a conductive layer (not shown), the conductive layer may be such as a metallic layer positioned adjacent to the heating coil 14. The electromagnetic induction from the heating coil 14 can form eddy current on the conductive layer, then the eddy current interacts with a resistance of the conductive layer, such that the conductive layer and/or the heating unit 11 generate heat to heat up the wafer 12 supported by the wafer support 10.

The insulating-and-heat-conducting unit 13 is positioned above the heating unit 11, the conduct portion 15 is positioned above the insulating-and-heat-conducting unit 13. The conduct portion 15 is the closest to or even contacts the wafer 12 supported by the wafer support 10. In practical use, the conduct portion 15 can be electrically connected to a bias power source 175, and form a bias on the conduct portion 15 via the bias power source 175. The bias power source 175 may be an AC power source or a direct-current (DC) power source, for forming an AC bias or a DC bias on the conduct portion 15.

The bias applied on the conduct portion 15 is for attracting a plasma disposed above the wafer support 10 and the wafer 12, thereby to cause deposition on a surface of the wafer 12 and form a thin film thereon. Specifically, the conduct portion 15 may be metallic, such as a titanic plate for supporting at least one wafer 12.

The insulating-and-heat-conducting unit 13 is disposed on the heating unit 11 and between the heating unit 11 and the conduct portion 15. The insulating-and-heat-conducting unit 13, as it is named, which is a material for thermal conductivity and insulation, such as alumina.

Without the insulating-and-heat-conducting unit 13, the AC flowing in the heating coil 14 may be conducted to the conduct portion 15 then affect the bias applied on the conduct portion 15, and therefore the bias power source 175 is unable to form a stable AC bias or DC bias in the conduct portion 15. Such that, the conduct portion 15 is unable to attract the plasma above the wafer 12 in a stable manner, which can be a drawback for forming a thin film with an evenly-distributed thickness on the surface of the wafer 12.

Therefore, to solve the abovementioned problem, the present disclosure provides the insulating-and-heat-conducting unit 13 that is disposed between the heating unit 11 and the conduct portion 15, and electrically insulates the heating unit 11 and the conduct portion 15 thereby. As so, the AC flowing in the heating coil 14 of the heating unit 11 cannot pass through the insulating-and-heat-conducting unit 13, and cannot conduct the conduct portion 15, thereby the bias power source 175 can form a stable AC bias or a DC bias on the conduct portion 15, for stably attract the plasma above the wafer 12, to facilitate forming a thin film with an evenly-distributed thickness on the surface of the wafer 12.

In one embodiment of the present disclosure, when the bias power source 175 provides a bias of 70 volts (V) to the conduct portion 15, if the heating coil 14 is not insulated from interfering the conduct portion 15, the bias power source 175 may be unable to form a stable bias about 70 V on the conduct portion 15, even if the bias power source 175 is able to provide a sufficient output, the result bias on the conduct portion 15 may vary in a range of 20V, therefore to result in an unstable bias on the conduct portion 15. On contrary, with the insulating-and-heat-conducting unit 13 disposed between the conduct portion 15 and the heating unit 11, the bias power source 175 is able to form a bias about 70V on the conduct portion 15, wherein the result bias on conduct portion 15 varies in a range smaller than 10V, therefore the conduct portion 15 has a relatively stable bias.

To be specific, the insulating-and-heat-conducting unit 13 can prevent the AC bias or a DC bias on the conduct portion 15 from affecting the AC flowing in heating coil 14, thereby temperatures of the wafer support 10 and the wafer 12 supported thereby can be stably controlled, to facilitate improving a quality of the thin-film deposition.

The insulating-and-heat-conducting unit 13 has an attribute of thermal conductivity, such that the heat generated from the heating unit 11 is transferred to the conduct portion 15 through the insulating-and-heat-conducting unit 13, then to increase the temperature of the wafer 12 supported by the wafer support 10 via the conduct portion 15.

The wafer support 10 can be connected to a support member 17. In one embodiment of the present disclosure, the support member 17 may be disposed with at least one first conduct unit 171 therein, wherein the first conduct unit 171 is electrically connected to the conduct portion 15 and the bias power source 175, and able to transfer the AC bias or a DC bias from the bias power source 175 to the conduct portion 15.

Additionally, the support member 17 may be disposed at least one second conduct unit 173 therein, wherein the second conduct unit 173 is electrically connected to the heating coil 14. In practical use, an AC can be transferred to the heating coil 14 through the second conduct unit 173, to increase the temperature of the heating unit 11.

In one embodiment of the present disclosure, the heating coil 14 of the heating unit 11 includes a first heating coil 141 and a second heating coil 143, wherein the second heating coil 143 is disposed to surround the first heating coil 141. Moreover, the first heating coil 141 and the second heating coil 143 can be connected to different second conduct units 173, to provide current with different current values to the first heating coil 141 and the second heating coil 143 respectively, for adjusting temperatures of different areas of the heating unit 11.

To be specific, the first heating coil 141 and the second heating coil 143 can be used to respectively heat and/or adjust temperatures of the heating unit 11, the conduct portion 15 and/or the first area (A1) and the second area (A2). For example, the first area (A1) is defined to include inner sides of the heating unit 11, the conduct portion 15 and/or the wafer support 10 or even closer to their centroids, and the second area (A2) is defined to include outer sides of the heating unit 11, the conduct portion 15 and/or the wafer support 10.

The wafer support 10 includes a plurality of thermal-detecting units 177, 179, such as at least one first thermal-detecting unit 177 and at least one second thermal-detecting unit 179 to detect temperatures of the first area (A1) and the second area (A2) of the heating unit 11, the conduct portion 15 and/or the wafer support 10.

The temperatures of different areas of the heating unit 11, the conduct portion 15 and/or the wafer support 10 can be detected respectively via the first thermal-detecting unit 177 and the second thermal-detecting unit 179. With adjustment of the current values that are provided to the first heating coil 141 and the second heating coil 143, the temperatures of different areas of the heating unit 11, the conduct portion 15 and/or the wafer support 10 are also adjustable, thereby able to have identical or approximate temperatures in each area of the heating unit 11, the conduct portion 15 and/or the wafer support 10.

In one embodiment of the present disclosure, the wafer support 10 may include at least one connecting seat 161 and at least one securing seat 163, wherein the connecting seat 161 is used to support and connect to the heating unit 11, and the securing seat 163 is used to support and secure the connecting seat 161.

Specifically, the connecting seat 161 may include a plurality of annular-connecting members, such as a first annular-connecting member 1611, a second annular-connecting member 1613 and/or a third annular-connecting member 1615. The support member 17 is surrounded by the first annular-connecting member 1611, the first annular-connecting member 1611 is surrounded by the second annular-connecting member 1613, and the second annular-connecting member 1613 is surrounded by the third annular-connecting member 1615. Also, the connecting seat 161 is assembled by the first annular-connecting member 1611, the second annular-connecting member 1613 and the third annular-connecting member 1615. However, the connecting seat 161 assembled by three members 1611, 1613, 1615, which is merely one embodiment of the present disclosure, not limited by claim scope of the present disclosure.

In one embodiment of the present disclosure, the connecting seat 161 may have an annular protrusion 1617 formed in an outer edge thereof, thereby to form a cavity in an inner area thereof. The heating unit 11 is disposed in the cavity of the connecting seat 161, as the annular protrusion 1617 surrounds the heating unit 11.

The securing seat 163 may be one single component, and have an annular protrusion 1631 formed in an outer edge thereof, thereby to form a cavity in an inner area thereof. The connecting seat 161 can be disposed in the cavity of the securing seat 163, such that the annular protrusion 1631 of the securing seat 163 surrounds the connecting seat 161.

In one embodiment of the present disclosure, the innermost first annular-connecting member 1611 of the connecting seat 161 may have an upper surface and lower surface disposed with a first annular-seal member 1612 and a second annular-seal member 1614 respectively, such as O-rings. The first annular-seal member 1612 on the upper surface of the first annular-connecting member 1611 contacts the heating unit 11, and the second annular-seal member 1614 on the lower surface of the first annular-connecting member 1611 contacts the securing seat 163. In practical use, a pressure difference between different areas may cause the heating unit 11 and the securing seat 163 to abut the connecting seat 161 and/or the first annular-connecting member 1611.

The first annular-seal member 1612 on the upper surface of the first annular-connecting member 1611 may approach or directly contact the heating unit 11, this can cause the first annular-seal member 1612 to start decaying later. To prevent the first annular-seal member 1612 from decaying, the first annular-seal member 1612 may be further disposed with a cooling passage 115 thereabove, which separates the heating unit 11 and the first annular-seal member 1612 and cools down the first annular-seal member 1612.

Figure 2:
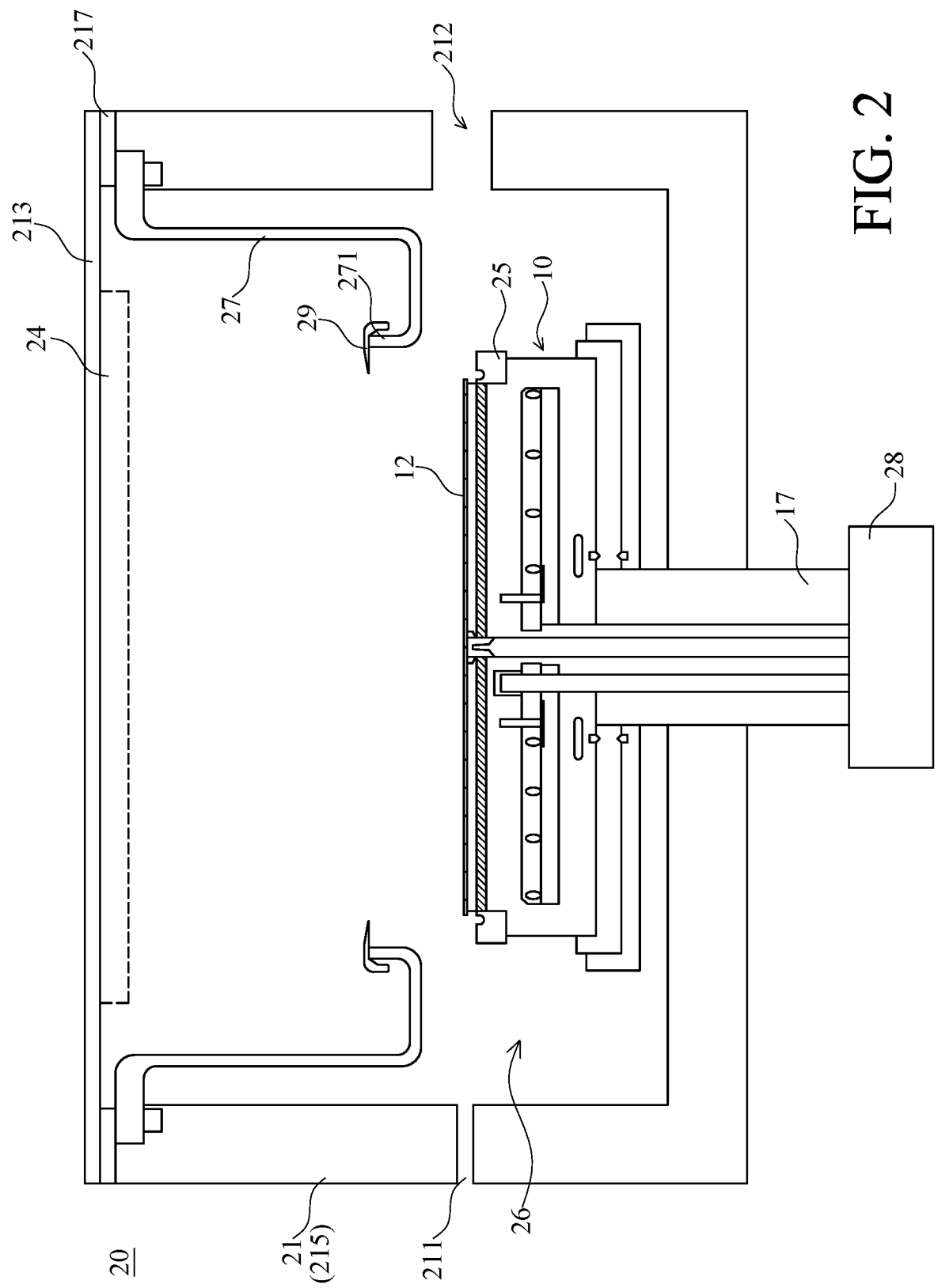
FIG. 2 and FIG. 3 are schematic sectional views of a thin-film deposition apparatus using the wafer support according to an embodiment of the present disclosure.

Referring to FIG. 2, which is a schematic sectional view of a thin-film deposition apparatus 20 using the wafer support according to an embodiment of the present disclosure. As shown, the thin-film deposition apparatus 20 mainly includes at least one wafer support 10 and a chamber 21, wherein the chamber 21 includes a containing space 26, the wafer support 10 is positioned within the containing space 26 for supporting at least one wafer 12.

In one embodiment of the present disclosure, the thin-film deposition apparatus 20 may be a physical-vapor deposition apparatus, and have the chamber 21 disposed with a target material 24 therein, wherein the target material 24 faces the wafer support 10 and/or the wafer 12. In one embodiment of the present disclosure, the chamber 21 may include a top plate 213 and a lower chamber 215. The top plate 213 is connected to the lower chamber 215 via an insulating portion 217, and forms the containing space 26 therebetween. The target material 24 is disposed on the top plate 213 to face the wafer support 10 and/or the wafer 12.

The chamber 21 is disposed with at least one gas inlet 211, wherein the gas inlet 211 is fluidly connected to the containing space 26 of the chamber 21, to transfer a process gas into the containing space 26 for performing the deposition process. The process gas may be such as noble gas, or reactive gas. Additionally, the chamber 21 may be disposed with a gas outlet thereabove, and extract the gas within the chamber 21 through the gas outlet by a pump.

The wafer support 10 further has an annular component 25 disposed thereon and surrounding the wafer 12, and a blocking member 27 disposed within the containing space 26 of the chamber 21 and around the wafer support 10. Specifically, the blocking member 27 has an end connected to the chamber 21, and another end formed with an opening. In one embodiment of the present disclosure, the another end of the blocking member 27, which is not connected to the chamber 21 may be formed with an annular protrusion 271. The annular protrusion 271 surrounds the opening of the blocking member 27, and may have a lid ring 29 disposed thereon.

The chamber 21 may include a material passage 212 for transporting the wafer 12. As shown in FIG. 2, the drive unit 28 can be connected to the support member 17, and drives the support member 17 to move the wafer support 10 away from the blocking member 27. Thereafter, a robotic arm may be applied to place the wafer 12 on the wafer support 10 through the material passage 212, also to extract the wafer 12 supported by the wafer support 10 out of the chamber 21 through the material passage 212.

Figure 3:
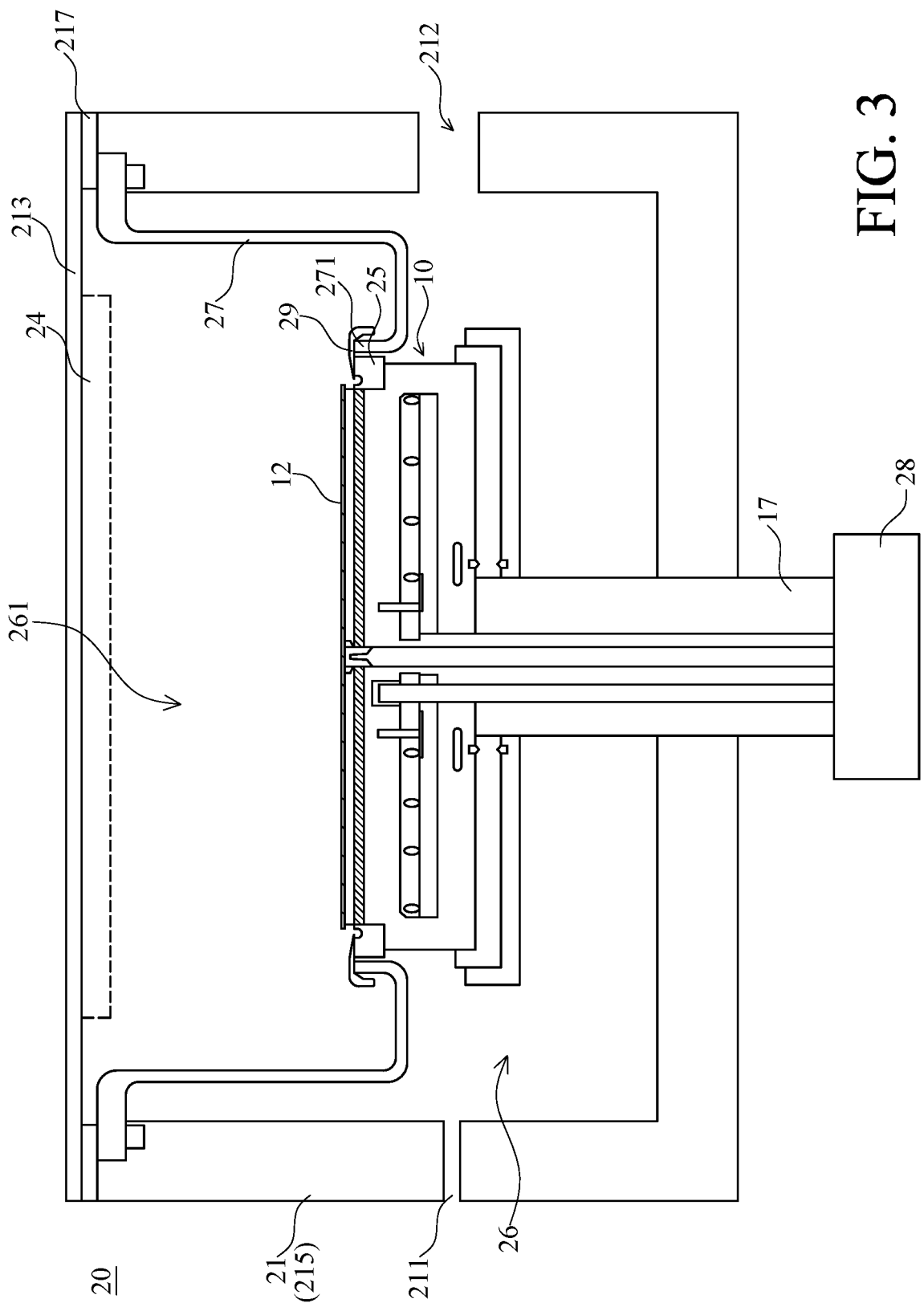

As shown in FIG. 3, the robotic arm places the wafer 12 on the wafer support 10, the drive unit 28 can drive the support member 17 to move the wafer support 10 and the wafer 12 thereon toward the blocking member 27, allow the annular component 25 of the wafer support 10 to contact the lid ring 29 on the blocking member 27 and to have the blocking member 27 and the lid ring 29 surrounding the wafer 12. The blocking member 27, the lid ring 39, the wafer support 10, wafer 12 and/or the annular component 25 can separate the containing space 26 of the chamber 21 into two areas. The area between the blocking member 27, the lid ring 29, the wafer support 10, the annular component 25 and/or the chamber 21 is defined as a reaction space 261, the target material 24 and the wafer 12 are disposed within the reaction space 261.

In the deposition process, the wafer support 10 heats up the wafer 12 by the heating unit 11, also applies biases on the top plate 213 and the wafer support 10 respectively. Meanwhile, the noble gas within the reaction chamber 261 is ionized, by an effect of high-voltage electric field from the biases. Then, the ionized noble gas is attracted by the bias on the target material 24 to blast the target material 24, thereby atoms or molecules flying out from the target material 24 is attracted by the bias on the wafer support 10 and deposited on the surface of the wafer 12.

Referring with FIG. 1, according to the present disclosure, the heating unit 11 and the conduct portion 15 of the wafer support 10 are separated by the insulating-and-heat-conducting unit 13, the AC flowing in the heating coil 14 of the heating unit 11 does not flow into the conduct portion 15, thereby the conduct portion 15 can have a stable the AC bias or DC bias, and therefore improve a quality of the thin-film deposition on the surface of the wafer 12.

Although the embodiments of the present disclosure are exemplified the PVD apparatus, however the PVD apparatus is not limited by the claim scope of the present disclosure, in practical use, the wafer support 10 according to the present disclosure may be also adapted in all of the CVD or ALD apparatuses that require heating and generating bias.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A wafer support for supporting at least one wafer, comprising:
    at least one heating unit comprising at least one heating coil for heating up the at least one wafer which is supported by the wafer support, wherein the at least one heating coil is disposed within the at least one heating unit;
    an electrically-insulating-and-heat-conducting unit disposed on the at least one heating unit, wherein the electrically-insulating-and-heat-conducting unit does not contact the at least one heating coil;
    a conduct portion disposed on the electrically-insulating-and-heat-conducting unit and electrically connected to a bias power source, wherein the heating unit, the electrically-insulating-and-heat-conducting unit and the conduct portion have disk-shaped appearances, and the electrically-insulating-and-heat-conducting unit and the conduct portion are disposed in a stack-up manner, wherein the electrically-insulating-and-heat-conducting unit is positioned between the at least one heating unit and the conduct portion, and electrically insulates the at least one heating unit and the conduct portion;
    a connecting seat supporting the at least one heating unit;
    a securing seat supporting the connecting seat, wherein a first annular-seal member is disposed between the connecting seat and the at least one heating unit, and a second annular-seal member is disposed between the securing seat and the connecting seat; and
    at least one cooling passage positioned between the at least one heating unit and the first annular-seal member, to separate the at least one heating unit and the first annular-seal member.

2. The wafer support as claimed in claim 1, wherein the at least one heating coil comprises a first heating coil and a second heating coil, and the second heating coil surrounds the first heating coil.

3. The wafer support as claimed in claim 2, further comprising a plurality of thermal-detecting units, wherein, the first heating coil and the second heating coil are used to respectively heat up a first area and a second area of the wafer support, and the thermal-detecting units are used to respectively detect temperatures of the first area and the second area of the wafer support.

4. The wafer support as claimed in claim 1, further comprising a support member connected to the wafer support, wherein, the support member is disposed with at least one first conduct unit electrically connected to the bias power source and the conduct portion, and the bias power source forms a bias on the conduct portion via the first conduct unit.

5. The wafer support as claimed in claim 4, wherein the bias power source is an alternating-current (AC) source forming an AC bias on the conduct portion via the first conduct unit.

6. The wafer support as claimed in claim 4, further comprising at least one second conduct unit positioned within the support member and electrically connected to the at least one heating coil.

7. The wafer support as claimed in claim 1, wherein:
the connecting seat includes a first annular-connecting member and a second annular-connecting member;
the second annular-connecting member is mounted to surround the first annular-connecting member;
the first annular-seal member is disposed between the first annular-connecting member and the at least one heating unit; and
the second annular-seal member is disposed between the first annular-connecting member and the securing seat.

8. A thin-film deposition apparatus, comprising:
a chamber comprising a containing space;
a wafer support disposed within the containing space for supporting at least one wafer and comprising:
  at least one heating unit that comprises at least one heating coil for heating up the at least one wafer supported by the wafer support, wherein the at least one heating coil is disposed within the at least one heating unit;
  a conduct portion that is disposed above the at least one heating unit and electrically connected to a bias power source, wherein the bias power source is used to form a bias on the conduct portion;
  an electrically-insulating-and-heat-conducting unit, wherein the heating unit, the electrically-insulating-and-heat-conducting unit and the conduct portion have disk-shaped appearances, and the heating unit, the electrically-insulating-and-heat-conducting unit and the conduct portion are disposed in a stack-up manner, wherein the electrically-insulating-and-heat-conducting unit is positioned between the at least one heating unit and the conduct portion for insulating the conduct portion from the at least one heating unit, and the electrically-insulating-and-heat-conducting unit does not contact the at least one heating coil;
  a connecting seat supporting the at least one heating unit;
  a securing seat supporting the connecting seat, wherein a first annular-seal member is disposed between the connecting seat and the at least one heating unit, and a second annular-seal member is disposed between the securing seat and the connecting seat; and
  at least one cooling passage positioned between the at least one heating unit and the first annular-seal member, to separate the at least one heating unit and the first annular-seal member; and
at least one gas inlet fluidly connected to the containing space of the chamber for transferring a process gas to the containing space.

9. The thin-film deposition apparatus as claimed in claim 8, wherein the at least one heating coil comprises a first heating coil and a second heating coil, and the second heating coil surrounds the first heating coil.

10. The thin-film deposition apparatus as claimed in claim 9, further comprising a plurality of thermal-detecting units, wherein, the first heating coil and the second heating coil are used to respectively heat up a first area and a second area of the wafer support, and the thermal-detecting units respectively detect temperatures of the first area and the second area of the wafer support.

11. The thin-film deposition apparatus as claimed in claim 9, further comprising a support member connected to the wafer support, the support member is disposed with at least one first conduct unit therein, wherein, the least one first conduct unit is electrically connected to the bias power source and the conduct portion, and the bias power source forms the bias on the conduct portion via the first conduct unit.

12. The thin-film deposition apparatus as claimed in claim 11, further comprising at least one second conduct unit positioned within the support member and electrically connected to the at least one heating coil.

13. The thin-film deposition apparatus as claimed in claim 11, wherein the bias power source is an alternating-current (AC) power source that forms an AC bias on the conduct portion via the first conduct unit.

14. The thin-film deposition apparatus as claimed in claim 11, further comprising a drive unit connected to the support member and driving the support member to move the wafer support.

15. The thin-film deposition apparatus as claimed in claim 8, wherein:
the connecting seat includes a first annular-connecting member and a second annular-connecting member;
the second annular-connecting member is mounted to surround the first annular-connecting member;
the first annular-seal member is disposed between the first annular-connecting member and the at least one heating unit; and
the second annular-seal member is disposed between the first annular-connecting member and the securing seat.

16. The thin-film deposition apparatus as claimed in claim 15, wherein the securing seat comprises an annular protrusion surrounding the connecting seat and forming a cavity to contain the connecting seat.

\* \* \* \* \*